(12) United States Patent
Stribley et al.

(10) Patent No.: US 7,973,385 B2
(45) Date of Patent: Jul. 5, 2011

(54) SEMICONDUCTOR DEVICE

(75) Inventors: Paul Stribley, Plymouth (GB); Christopher Lee, Plymouth (GB); John Ellis, Tavistock (GB)

(73) Assignee: X-Fab Semiconductor Foundries AG (DE)

( * ) Notice: Subject to any disclaimer, the term of this patent is extended or adjusted under 35 U.S.C. 154(b) by 260 days.

(21) Appl. No.: 12/374,550

(22) PCT Filed: Jul. 23, 2007

(86) PCT No.: PCT/GB2007/050433
§ 371 (c)(1),
(2), (4) Date: Apr. 7, 2009

(87) PCT Pub. No.: WO2008/009998
PCT Pub. Date: Jan. 24, 2008

(65) Prior Publication Data
US 2009/0243034 A1      Oct. 1, 2009

(30) Foreign Application Priority Data
Jul. 21, 2006    (GB) .................................. 0614495.0

(51) Int. Cl.
*H01L 29/00*    (2006.01)
*H01L 29/76*    (2006.01)
*H01L 29/94*    (2006.01)
*H01L 31/062*   (2006.01)
*H01L 31/113*   (2006.01)
*H01L 31/119*   (2006.01)

(52) U.S. Cl. ........ 257/531; 257/379; 257/516; 257/904; 257/E21.022

(58) Field of Classification Search .................. 257/379, 257/516, 531, 904, E21.022
See application file for complete search history.

(56) References Cited

U.S. PATENT DOCUMENTS

| | | | | |
|---|---|---|---|---|
| 5,952,704 | A | * | 9/1999 | Yu et al. .......................... 257/531 |
| 6,225,677 | B1 | | 5/2001 | Kobayashi ..................... 257/531 |

(Continued)

FOREIGN PATENT DOCUMENTS
EP      1160841 A2    12/2001
(Continued)

OTHER PUBLICATIONS

PCT International Search Report, PCT/GB2007/050433 (dated Oct. 11, 2007; published Jan. 24, 2008). Search Report, United Kingdom, Appl. # GB 0614495.0, Nov. 23, 2006.

*Primary Examiner* — Ida M Soward
(74) *Attorney, Agent, or Firm* — Thompson Hine LLP

(57) ABSTRACT

A semiconductor device including a doped substrate of a first doping polarity and a doped semiconductor material of a second doping polarity. The semiconductor material is on, or in, the substrate, and the second doping polarity is opposite the first doping polarity such that the semiconductor material and the substrate form a diode. The semiconductor device further includes an inductor on or above the semiconductor material, and a pattern in the semiconductor material for reducing eddy currents. The pattern includes a doped semiconductor material of the first doping polarity and a least one trench within the doped semiconductor material of the first doping polarity, wherein, at least at a depth at which the trench is closest to the inductor, the doped semiconductor material of the first doping polarity fully surrounds the trench so that, at least at the depth, the trench does not touch the doped semiconductor material of the second doping polarity.

23 Claims, 6 Drawing Sheets

U.S. PATENT DOCUMENTS

| | | | |
|---|---|---|---|
| 6,310,387 B1 * | 10/2001 | Seefeldt et al. | 257/531 |
| 6,605,857 B2 * | 8/2003 | Wong et al. | 257/531 |
| 6,921,959 B2 * | 7/2005 | Watanabe | 257/531 |
| 7,161,248 B2 * | 1/2007 | Karasawa et al. | 257/758 |
| 7,173,291 B2 * | 2/2007 | Asano | 257/173 |
| 7,248,480 B2 * | 7/2007 | Chiba | 361/776 |
| 7,262,681 B2 * | 8/2007 | Hurley | 336/200 |
| 2001/0045616 A1 * | 11/2001 | Yoshitomi | 257/531 |
| 2004/0195650 A1 * | 10/2004 | Yang et al. | 257/531 |
| 2005/0040471 A1 * | 2/2005 | Harris et al. | 257/379 |
| 2006/0065947 A1 | 3/2006 | Ojala | 257/531 |
| 2006/0065948 A1 | 3/2006 | Yeh et al. | 257/531 |
| 2006/0128112 A1 | 6/2006 | Erickson et al. | 438/424 |
| 2006/0163694 A1 * | 7/2006 | Ohguro | 257/531 |
| 2009/0015363 A1 * | 1/2009 | Gardner | 336/200 |

FOREIGN PATENT DOCUMENTS

| | | |
|---|---|---|
| JP | 07 335441 A | 12/1995 |
| JP | 2004/158718 A | 6/2004 |
| WO | WO 98/50956 | 11/1998 |
| WO | 2008/009998 A1 | 1/2008 |

* cited by examiner

SEMICONDUCTOR DEVICE

The present invention relates to a semiconductor device. The present invention finds particular application in RF-CMOS circuits, although it may also be used in other contexts. Preferred embodiments of the invention aim to prevent or reduce eddy currents within the semiconductor device.

BACKGROUND

RF-CMOS circuits often require inductors as part of their function. The ability to manufacture on-chip inductors is often a key capability for any CMOS technology to fulfil the requirements of RF circuits. These inductors are usually substantially planar spirals or coils of wiring which are patterned in the top level of metal to minimise the parasitic capacitance to substrate.

One characteristic of an inductor is its quality factor (Q value). This is defined as the ratio of the imaginary to the real parts of the electrical admittance or the ratio of the energy stored to the energy dissipated over one frequency cycle. Q varies with frequency. The lower curve in FIG. 1 shows an example of how Q may vary for a particular inductor.

On-chip inductors often suffer from quite poor quality factor, often less than 8. One of the reasons for the poor Q is the inductive loss to the substrate. The substrate is a conductor in close proximity and so the varying magnetic field from the inductor causes current to flow in it—this is called the induced eddy current. Eddy currents dissipate energy due to the resistance of the substrate causing heating. The currents also influence the inductor itself, counteracting the current in the inducing coil. This causes energy loss in the inductor—reducing its Q value. Energy loss is to some extent unavoidable, but it is an aim of preferred embodiments of the invention to minimise it.

In many semiconductor devices the substrate material is the common grounded wafer substrate which is shared by all the other components. If the resistance of the substrate is low, as is often the case with modern semiconductor processes, these inductor losses are considerably enhanced and very poor Q values are seen. By increasing the substrate resistance the Q values are improved.

Another technique to improve Q is to electrically shield the substrate from the magnetic field by placing a grounded conductor (e.g. made using a metal layer or polysilicon) between the inductor and substrate, the grounded conductor being insulated from the substrate. This grounded shield can be patterned to prevent eddy current losses in the shield itself, but the presence of a ground shield often increases the capacitance of the inductor to ground because it is physically closer to the inductor than the substrate.

SUMMARY

Preferred embodiments of the present invention seek to address the above problems.

One or more aspects of the invention is/are set out in the independent claim(s).

BRIEF DESCRIPTION OF THE DRAWINGS

Some preferred embodiments of the invention will now be described by way of example only and with reference to the accompanying drawings, in which.

DETAILED DESCRIPTION

Figure 2:
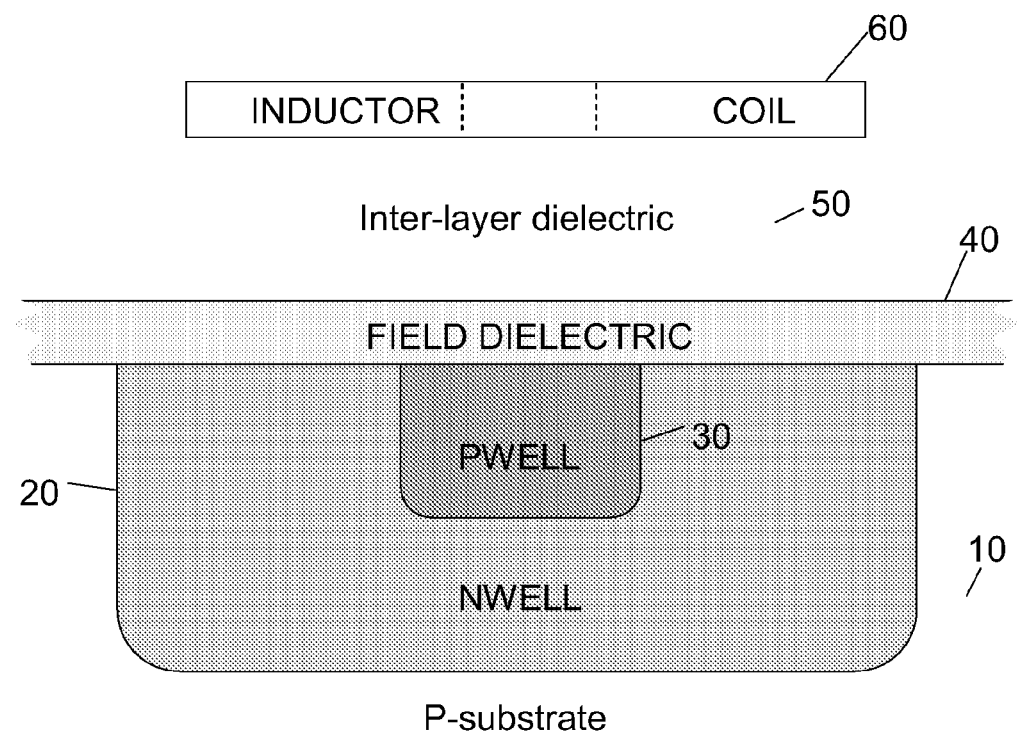
FIG. 2 shows a sectional view of a first embodiment of the present invention.

Referring to FIG. 2, which shows a cross-sectional view of a first embodiment of the present invention, the semiconductor device has a p-substrate 10 over which a field dielectric layer 40 and inter-layer dielectric 50 is placed. An inductor coil 60 is formed on the inter-layer dielectric 50, as is known in the art.

In this embodiment the substrate 10 under the inductor 60 is patterned and doped so that the net resistance of the underlying semiconductor is increased considerably beyond that seen on undoped substrates. In order to achieve this, a wafer is used with thick (about 15 μm to 20 μm) very low p-type doped silicon epitaxy on a p-type doped wafer base substrate 10. An n-well 20 is then implanted into the region where the inductor 60 is to be made. This is deeply implanted and thermally driven to create a low-doped n-well region 20 about 10 μm to 15 μm deep. The n-well 20 and the p-substrate 10 hence form a diode.

A further patterning step is then made with an implant of p-well 30 which is then thermally driven into the deep n-well 20 so that a p-type to n-type junction diode is created which extends part way into the n-well 20. The depth of the p-well 30 is such that the p-well 30 is still contained within the n-well 20 so that it is electrically isolated from the p-substrate 10. However, the p-well 30 can be driven to a depth where the remaining n-well thickness is much smaller than in other areas where there is no p-well 30. The n-well 20 is junction isolated from the p-substrate 10, and the internal p-well shape 30 is junction isolated from the n-well 20 and also from the underlying p-substrate 10. The field dielectric 40, inter-layer dielectric 50 and inductor coil 60 are then formed on the substrate 10, n-well 20 and p-well 30.

Figure 3:
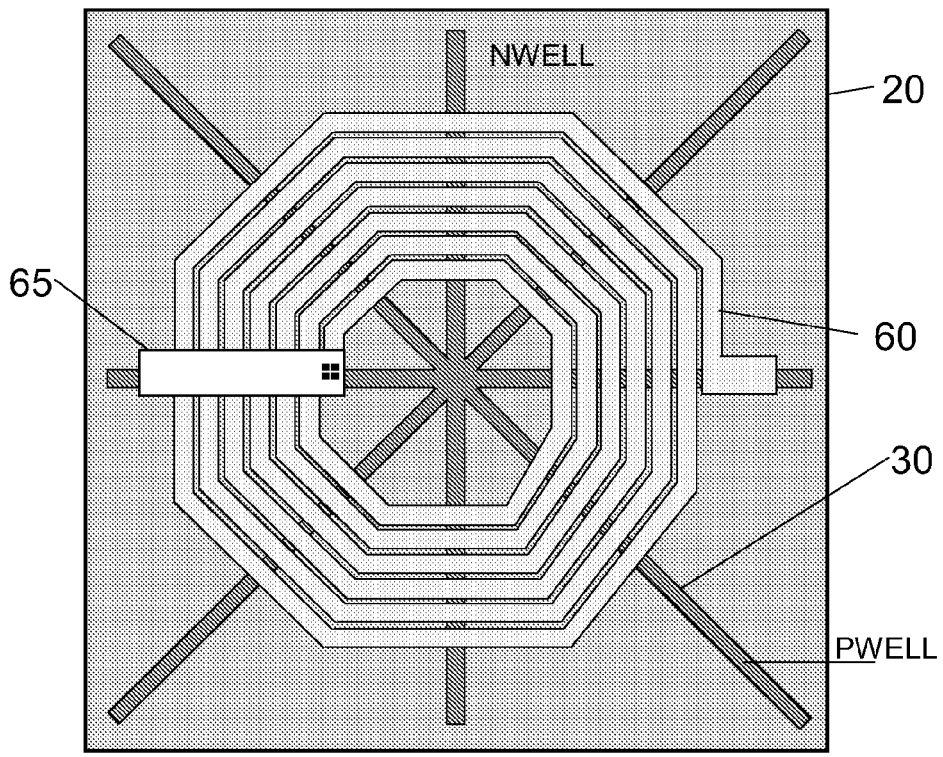
FIG. 3 shows a top view of the embodiment of FIG. 2.

As can be seen in FIG. 3, the p-well shape 30 is configured as a star so that the arms of the star 30 extend outwards towards the edge of the n-well 20, but they do not reach the edge of the n-well 20 and do not extend beyond it. Thus the star 30 is kept isolated laterally from the common p-substrate area 10. The star 30 is arranged so that its centre is placed at (or rather below) the centre of the inductor 60 which is to be made, somewhat similar to the spokes of a wheel. The arms of the star 30 are extended so that they pass under the physical width of the inductor coil 60 and extend a short distance further. In this way the inductive eddy currents from the inductor are suppressed or reduced because the currents tend to occur as a circular current image of the inductor 60—rather like a reflection of the inductor coils. The circular current flow in the n-well 20 encounters p-well barriers 30 to the flow around the circle, which barriers are arranged perpendicular to the induced eddy current flow. Due to the p-well depth in the n-well 20 the resistance of the n-well 20 under the p-well 30 is very high. This increases the resistance of the eddy current loop considerably.

The junction isolation of the n-well 20 from the common p-substrate 10 prevents the currents flowing from the n-well 20 to substrate 10. A carrier depletion region is naturally created between the n-well 20 and p-substrate 10 which further increases the resistance of the deep n-well 20. Being lightly doped, the n-well 20 already has considerable resistance.

The diffused well 30 can be fabricated underneath the field oxide region 40 of the semiconductor wafer, which is used to isolate adjacent semiconductor components, e.g. transistors. This means that the parasitic capacitance of the inductor metal 60 to the underlying silicon is minimised—because the dielectric between them is as thick as possible in the semiconductor process.

FIG. 3 also shows a connection 65 crossing the windings of the inductor 60 so as to form a connection for the innermost end of the inductor coil 60.

Figure 4:
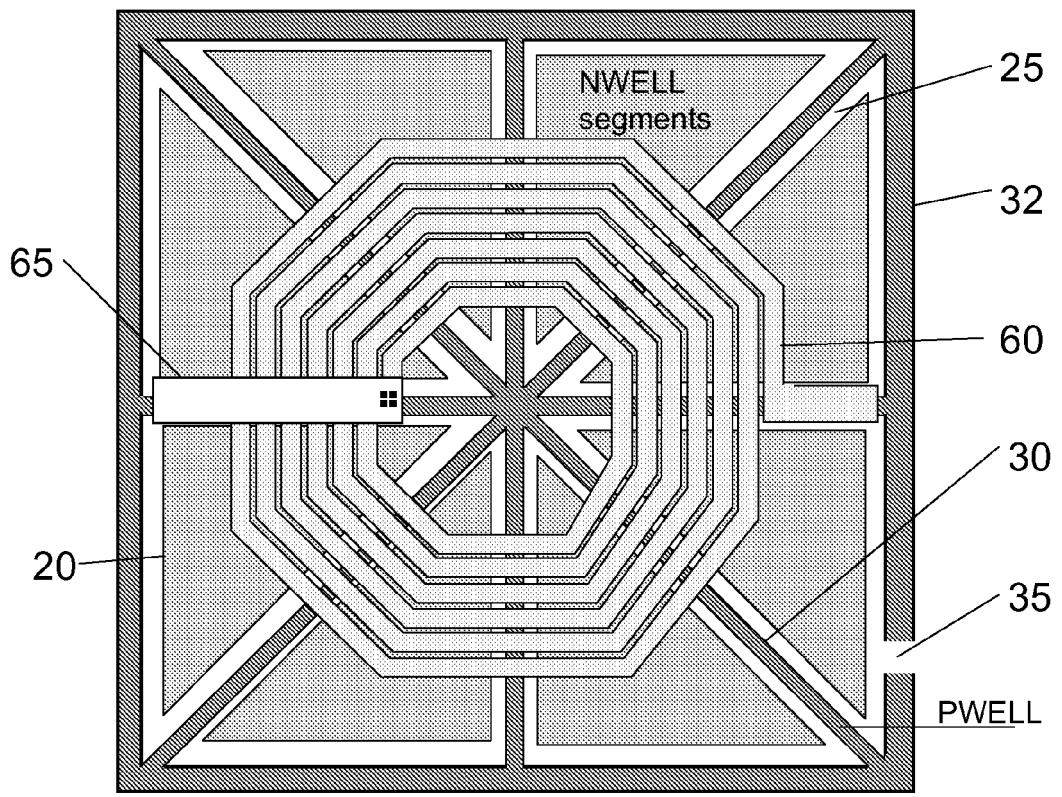
FIG. 4 shows a top view of a second embodiment according to the present invention.

FIG. 4 shows a second embodiment. This is in many respects similar to the first embodiment, and like features will not be explained again. In the second embodiment the p-well 30 is patterned and diffused so that it connects all the way through the n-well region 20 to the p-substrate 10 underneath. Then the remaining n-well 20 forms a circular arrangement of triangular slices, with grounded p-well 30 in between. The eddy current flow is reduced since it needs to flow through reverse biased semiconductor junctions under the inductor 60.

In the FIG. 4 embodiment, an outer ring 32 is formed as part of the p-well. This is however interrupted at 35, to impede eddy currents from flowing around ring 32.

Ring 32 is optional. Similarly, an outer ring could also be provided in the FIG. 3 embodiment.

Further, FIG. 4 shows regions 25 around the triangular n-well portions 20 and within the grid of the p-well portions 30. These regions 25 are merely intended to indicate that, during manufacture, these regions 25 are left unimplanted, that is, the areas implanted for creating the n-well 20 and the areas implanted for creating the p-well 30 do not meet. However, as the n-implanted regions 20 and the p-implanted regions 30 are thermally driven they "close the gap", i.e. they meet while diffusing.

In a third embodiment (not illustrated) the n-well regions are patterned and diffused and then a deep trench is cut into the silicon surface. A trench cut is a narrow region where the silicon is etched away and then re-filled with an insulator (although the trench could also be left empty). The trench extends part way through the silicon well region, several micrometer deep and is only a few micrometer wide. The third embodiment is essentially based on the first embodiment except that trenches are provided instead of p-well regions. Because the trench cut prevents current flow laterally across it, the eddy currents at the silicon surface are reduced.

The third embodiment can be combined with the first or second embodiment. That is, the provision of a deep trench can be combined with the n-well and p-well patterning to minimise the eddy currents under the inductor 60 as described above. This is shown in cross section in FIG. 5. The trench cut 70 pattern follows the star shape of the p-well 30 under the inductor, see FIG. 6. The combination of junction isolation, physical separation with a trench cut 70, and the high resistivity of low doped semiconductor regions makes the effective resistance under the inductor 60 much higher than unpatterned areas. Hence the eddy currents are suppressed and the Q factor of the inductor 60 fabricated above the pattern is improved.

Figure 6:
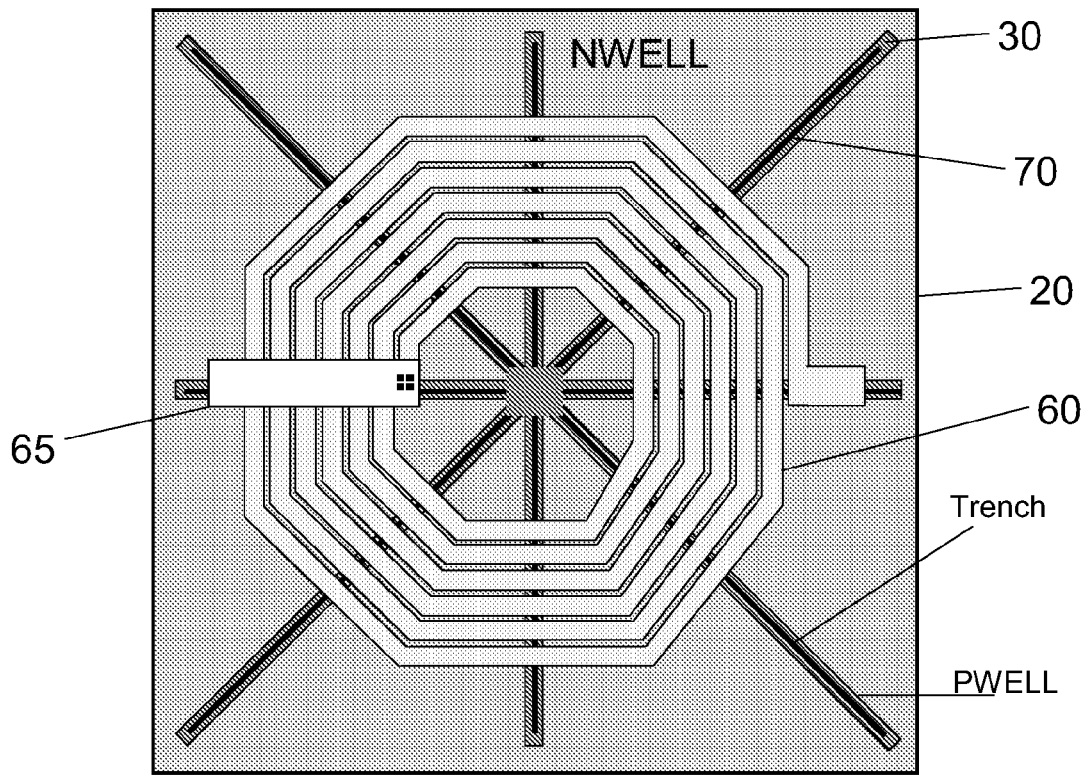
FIG. 6 shows a top view of the embodiment shown in FIG. 5.

The trenches shown in FIG. 6 do not touch or cross each other in the centre of the device, i.e. each trench "arm" of the star shape stops before the central area (where the p-well "arms" are joined).

Although no outer frame is shown in FIG. 6, an outer frame such as outer p-well frame 32 can be provided in the FIG. 6 embodiment, similar to the FIG. 4 embodiment.

As shown in FIG. 6, the longitudinal ends of the trenches 70 are "encapsulated" within the p-well 30, that is, in longitudinal direction the trenches 70 do not reach the n-well 20. Also in lateral direction the trenches are separated from the n-well 20 by some p-well material 30.

Figure 5:
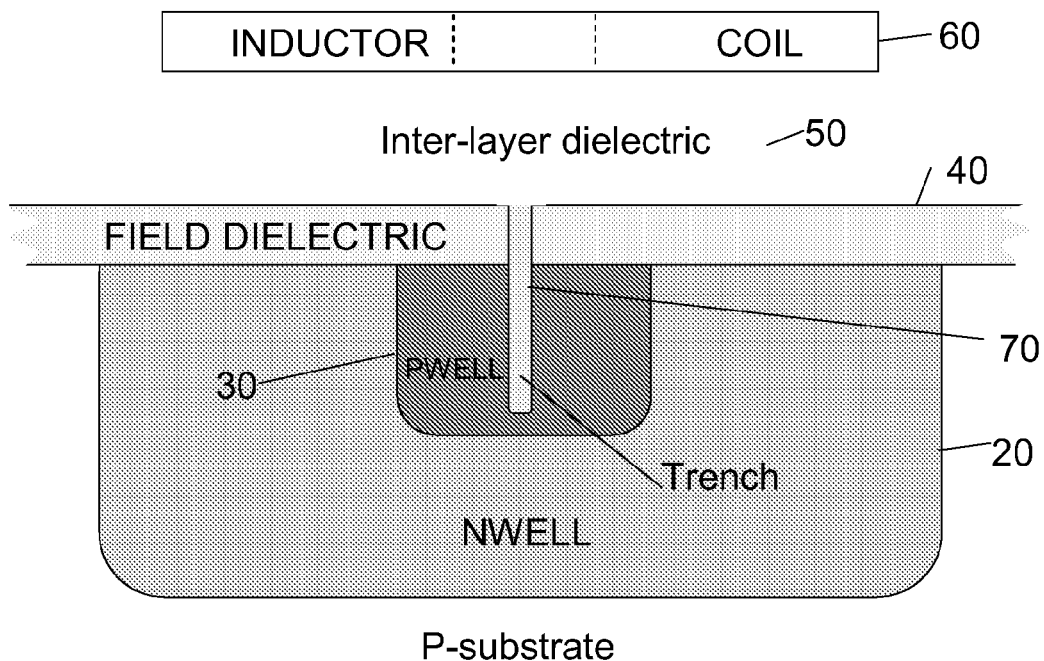
FIG. 5 shows a cross-sectional view of a third embodiment of the present invention.

Further, whilst FIG. 5 shows that the p-well 30 and the trench 70 do not reach the p-substrate 10, it would alternatively be possible to extend the p-well 30 and/or the trench 70 in their depth so that they reach the substrate 10.

Figure 7:
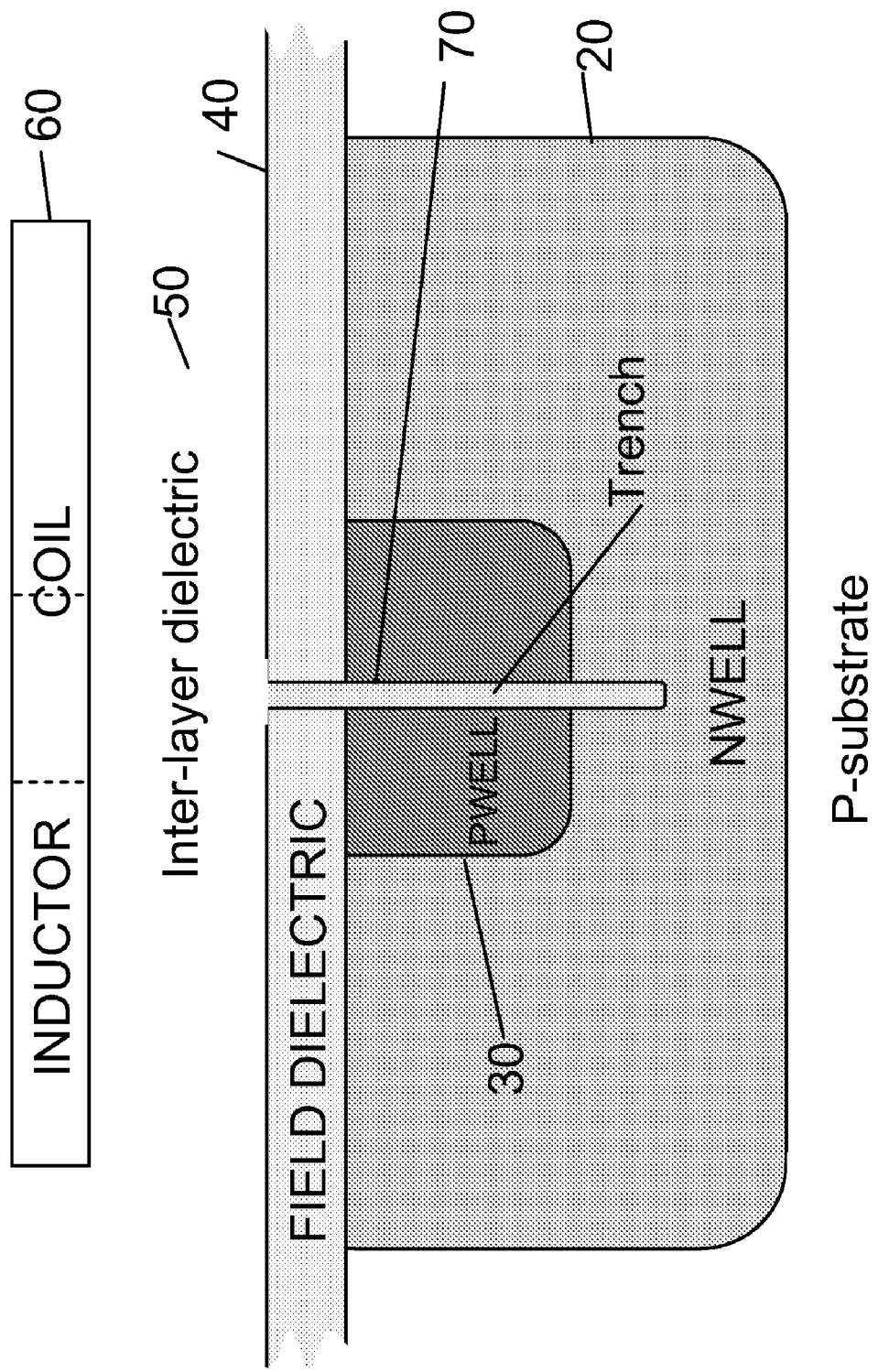
FIG. 7 shows a cross-sectional view of a fourth embodiment of the present invention.

It would also be possible for trench 70 to reach the n-well 20 without the p-well reaching the p-substrate 10. This is shown in FIG. 7, where trench 70 penetrates approximately half-way into the n-well 20 (that is, the distance between the lower end of the trench 70 and the substrate 10 is approximately as long as the distance between the lower end of the trench 70 and the lower end of the p-well 30). Other degrees of penetration are possible, including the case where the trench 70 only just reaches n-well 20 (in this case the trench would penetrate into n-well 20 by 0%) and the case where the trench 70 reaches the substrate (in this case the trench would penetrate into n-well 20 by 100%).

Figure 8:
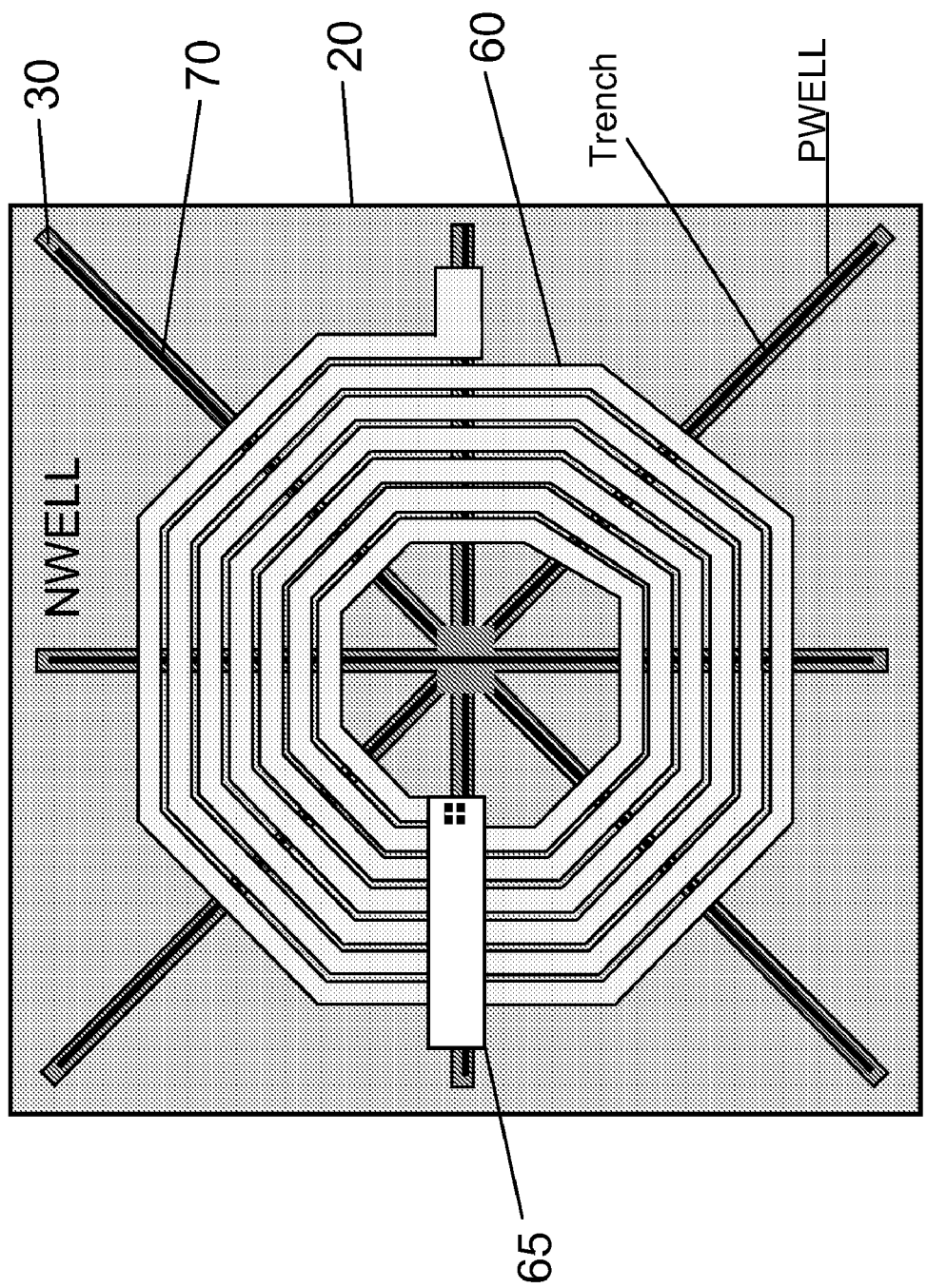
FIG. 8 shows a top view of a fifth embodiment of the present invention.

FIG. 8 shows an alternative embodiment very similar to the FIG. 6 embodiment, the difference being that two trench "arms" of the star shape, which are situated opposite each other, meet in the centre of the device so as to form one trench which is excavated through the centre of the device. However, none of the other trench "arms" 70 touch or cross this single, continuous trench.

In all cases the n-well 20 and p-well 30 zones do not have to be deliberately connected or voltage biased in order to improve the Q-value of the overlying inductor 60. The improvement is due to the effective resistance of the patterned diffusion.

Figure 9:
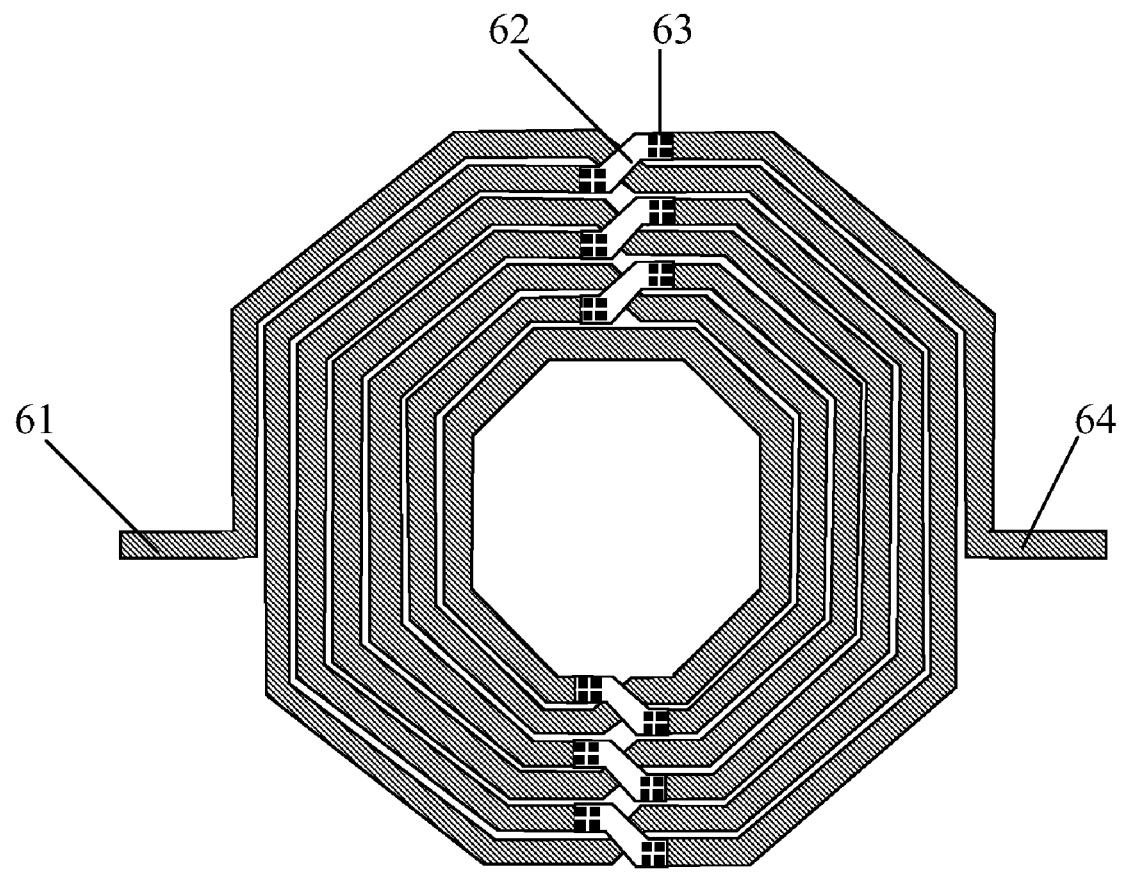
FIG. 9 shows a top view of an inductor of a sixth embodiment of the present invention.

FIG. 9 shows the inductor according to an alternative embodiment. The inductor of FIG. 9 is an inductor which one skilled in the art would normally refer to as balanced, centretapped, symmetric or counter-wound. Balanced inductors per se are known to those skilled in the art. As shown in FIG. 9, starting from one end 61 of the inductor 60, the metal track of the inductor makes a quarter turn before deviating radially inwardly (by slightly more than the width of the metal track) to "cross under" "bridge" portion 62. The inductor then makes a half turn before again deviating radially inwardly to form a corresponding bridge portion (near the lower edge of FIG. 9). The bridge portions 62 are formed by a slightly raised portion of metal, connected to the remainder of the inductor by means of a via 63. The inductor then makes another half turn before again deviating radially inwardly to cross under a bridge portion 62. This repeats until the inductor has formed a bridge to reach an inner diameter of the coil. It then makes substantially a full turn and then crosses through the lastmentioned bridge etc., successively forming the bridge portions in the upper half of the figure and crossing under the bridges formed in the lower half of the figure. The inductor is completed at a second end 64. The inductor 60 shown in FIG. 9 can be used instead of the inductors 60 shown in FIGS. 3, 4, 6 and 8.

Whilst the above embodiments have been described with reference to a star pattern, it would also be possible for example to use a cross, "plus" sign or snowflake shape. Other shapes may also be used, provided they reduce the eddy currents.

It will be appreciated that all polarities could be reversed, that is, one could use an n-substrate, in or on which is formed a p-well, in which an n-well is formed to reduce eddy currents.

Whilst it is preferred that in the above embodiments the n-well region 20 is implanted into the p-substrate 10, it would alternatively be possible to provide an n-doped layer on the p-substrate 10. In this case the n-doped semiconductor layer would not be provided "in" the p-substrate 10 but "on" the p-substrate 10.

Whilst for ease of understanding various positional or directional terms have been used (such as "on" or "above"), it will be appreciated that these have been used for illustration purposes rather than as a limitation. These terms assume that the semiconductor device is orientated as shown in FIGS. 2 and 5.

In preferred embodiments the trench(es) have a depth of at least 1 µm, preferably about 2 µm.

In the present specification reference has been made to the centre of the pattern corresponding to the centre of the inductor. It will be understood that this preferably refers to a projection (perpendicular to the plane in which the inductor is located, or perpendicular to the surface of the device) of the inductor onto the level at which the pattern is located.

By way of summary, some features of preferred embodiments of the present invention are as follows:

A thick low p-type doped epitaxial semiconductor on p-type wafer substrate can be used.

A deep n-well is implanted and diffused several micrometer in the epitaxial region. It is made larger than the inductor so that it fully encloses the coil.

A p-well is implanted and diffused a few micrometer in the n-well region.

The p-well is patterned as a star shape, lying under the inductor coil like the spokes of a wheel. It is drawn within the large n-well region.

The deep n-well region may contain the p-well shape completely, or alternatively the p-well may connect vertically to the p-substrate. In the latter case the n-well region becomes cut into a series of triangular slices.

An optional deep trench in a star shape is cut into the p-well shape to further increase the resistance of the pattern.

A field oxide layer is used above the pattern to maximise the dielectric thickness between the semiconductor region and the inductor. This minimises the parasitic capacitance of the inductor coil to substrate.

Features which increase the sub-inductor semiconductor effective resistance include:
  high resistance of very low doped semiconductor
  junction isolation between n-well and substrate vertically
  junction isolation between n-well and p-well laterally
  trench isolation between various conductive semiconductor zones
  patterning the isolation scheme as a cross or star shape under the inductor so that it has a maximum effect, perpendicular to the direction of induced eddy current flow.

Figure 1:
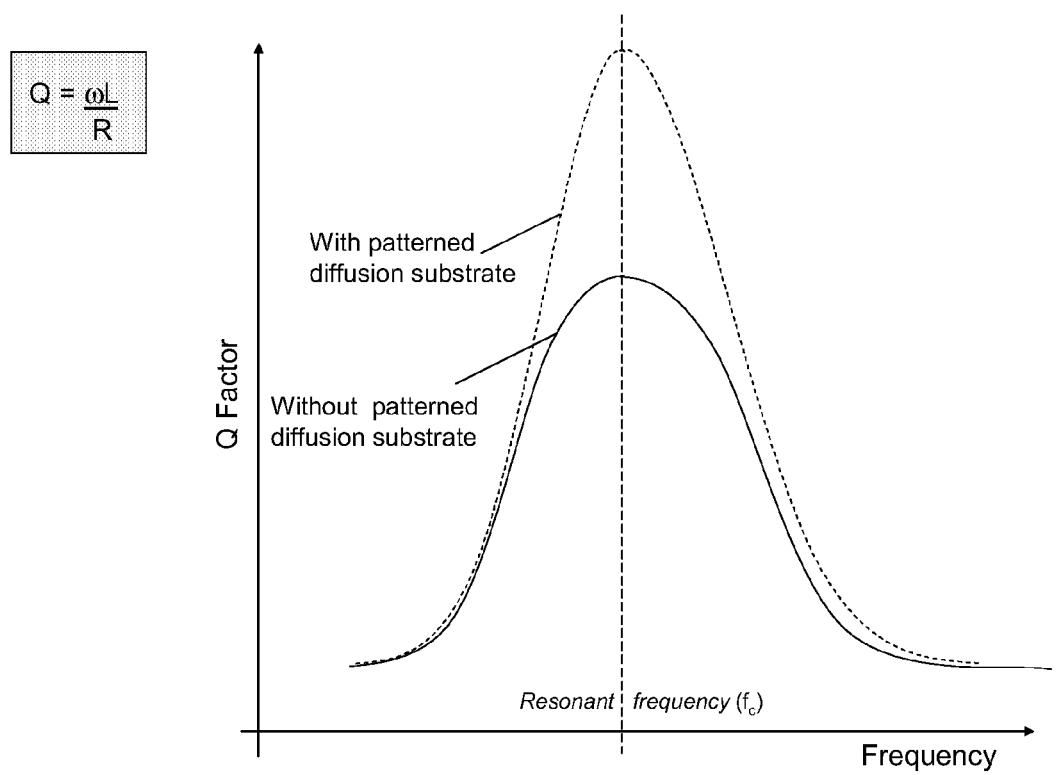
FIG. 1 shows a diagram plotting the Q factor against frequency for a prior art inductor (lower curve) and an inductor according to an embodiment of the present invention (upper curve)

The upper curve in FIG. 1 shows an example of how the provision of an eddy current reducing pattern as per embodiments of the present invention can improve the Q-value when compared with an otherwise identical semiconductor device without the eddy current reducing pattern (lower curve).

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

What is claimed is:

1. A semiconductor device comprising:
  a doped substrate of a first doping polarity;
  a doped semiconductor material of a second doping polarity, wherein the semiconductor material of the second doping polarity is on, or in, the substrate, and wherein the second doping polarity is opposite the first doping polarity such that the semiconductor material of the second doping polarity and the substrate form a diode;
  an inductor on or above the semiconductor material of the second doping polarity; and
  a pattern in the semiconductor material of the second doping polarity for reducing eddy currents, wherein the pattern comprises:
    a doped semiconductor material of the first doping polarity arranged so as to reduce eddy currents; and
    at least one trench within the doped semiconductor material of the first doping polarity, the trench being arranged so as to reduce eddy currents, wherein, at least at a depth at which the trench is closest to the inductor, the doped semiconductor material of the first doping polarity fully surrounds the trench so that, at least at said depth, the trench does not touch the doped semiconductor material of the second doping polarity.

2. A semiconductor device according to claim 1, wherein the semiconductor material of the first doping polarity is arranged to reduce eddy currents in the semiconductor material of the second doping polarity.

3. A semiconductor device according to claim 1, wherein the at least one trench is arranged to reduce eddy currents in the semiconductor material of the second doping polarity.

4. A semiconductor device according to claim 1, wherein the inductor comprises a coil.

5. A semiconductor device according to claim 4, wherein the inductor coil is balanced, center-tapped, symmetric or counter-wound.

6. A semiconductor device according to claim 1, wherein the inductor comprises a spiral.

7. A semiconductor device according to claim 1, wherein the pattern extends beyond the area covered by the inductor.

8. A semiconductor device according to claim 1, wherein the pattern does not reach the substrate.

9. A semiconductor device according to claim 1, wherein the pattern reaches the substrate.

10. A semiconductor device according to claim 9, wherein the doped semiconductor material of the first doping polarity reaches the substrate.

11. A semiconductor device according to claim 9, wherein the at least one trench reaches the substrate.

12. A semiconductor device according to claim 1, wherein portions of the pattern cross portions of the inductor at an angle of between 60 and 120 degrees.

13. A semiconductor device according to claim 1, wherein the at least one trench is filled with an insulating material.

14. A semiconductor device according to claim 1, wherein the doped semiconductor material of the first doping polarity comprises a well formed in the doped semiconductor material of the second doping polarity.

15. A semiconductor device according to claim 14, wherein the well of the pattern comprises portions which are arranged substantially so as to form a star, "plus" sign, cross or snowflake shape.

16. A semiconductor device according to claim 14, wherein the well of the pattern comprises portions which cross each other in a position which corresponds to the center of the inductor.

17. A semiconductor device according to claim 1, wherein the pattern comprises an arrangement of trenches.

18. A semiconductor device according to claim 17, wherein the trenches are arranged so as to substantially form a star, "plus" sign, cross or snowflake shape.

19. A semiconductor device according to claim 17, wherein the trenches do not cross each other.

20. A semiconductor device according to claim 17, wherein an extrapolation of the trenches radiates out from a position which corresponds to the center of the inductor.

21. A semiconductor device according to claim 17, wherein the arrangement of trenches comprises a trench which runs through a position which corresponds to the center of the inductor.

22. A semiconductor device comprising:
a doped substrate of a first doping polarity;
a doped semiconductor material of a second doping polarity, wherein the semiconductor material is on, or in, the substrate, and wherein the second doping polarity is opposite the first doping polarity such that the semiconductor material and the substrate form a diode;
an inductor on or above the semiconductor material; and
a pattern in the semiconductor material for reducing eddy currents, wherein the pattern comprises:
a doped semiconductor material of the first doping polarity; and
at least one trench within the doped semiconductor material of the first doping polarity, the trench having a depth of at least 1 micrometer, wherein, at least at a depth at which the trench is closest to the inductor, the doped semiconductor material of the first doping polarity fully surrounds the trench so that, at least at said depth, the trench does not touch the doped semiconductor material of the second doping polarity.

23. A semiconductor device comprising:
a doped substrate of a first doping polarity;
a doped semiconductor material of a second doping polarity, wherein the semiconductor material is on, or in, the substrate, and wherein the second doping polarity is opposite the first doping polarity such that the semiconductor material and the substrate form a diode;
an inductor on or above the semiconductor material; and
a pattern in the semiconductor material for reducing eddy currents, wherein the pattern comprises:
a doped semiconductor material of the first doping polarity; and
at least two substantially straight trenches within the doped semiconductor material of the first doping polarity, wherein, at least at a depth at which the trenches are closest to the inductor, the doped semiconductor material of the first doping polarity fully surrounds the trenches so that, at least at said depth, the trenches do not touch the doped semiconductor material of the second doping polarity, wherein the at least two trenches do not touch or cross each other.

* * * * *